(12) United States Patent
Liu et al.

(10) Patent No.: US 10,629,607 B1
(45) Date of Patent: Apr. 21, 2020

(54) SEMICONDUCTOR CMOS NON-VOLATILE MEMORY DEVICE

(71) Applicants: David Liu, Fremont, CA (US); Ben Sheen, Saratoga, CA (US)

(72) Inventors: David Liu, Fremont, CA (US); Ben Sheen, Saratoga, CA (US)

( * ) Notice: Subject to any disclaimer, the term of this patent is extended or adjusted under 35 U.S.C. 154(b) by 0 days.

(21) Appl. No.: 16/158,099

(22) Filed: Oct. 11, 2018

(51) Int. Cl.
| | | |
|---|---|---|
| G11C 16/04 | (2006.01) | |
| H01L 27/1156 | (2017.01) | |
| H01L 27/11558 | (2017.01) | |
| H01L 29/788 | (2006.01) | |
| H01L 27/092 | (2006.01) | |

(52) U.S. Cl.
 CPC ...... *H01L 27/1156* (2013.01); *G11C 16/0433* (2013.01); *H01L 27/0924* (2013.01); *H01L 27/11558* (2013.01); *H01L 29/7885* (2013.01)

(58) Field of Classification Search
 CPC ............ H01L 27/1156; H01L 27/0924; H01L 27/11558; H01L 29/7885; G11C 16/0433
 See application file for complete search history.

(56) References Cited

U.S. PATENT DOCUMENTS

| | | | |
|---|---|---|---|
| 8,716,803 B2 | 5/2014 | Wang | |
| 2013/0181184 A1* | 7/2013 | Sakuma | .......... H01L 21/823431 257/5 |
| 2019/0051659 A1* | 2/2019 | Xie | .................... H01L 29/40114 |
| 2019/0238134 A1* | 8/2019 | Lee | ...................... H01L 23/5389 |

OTHER PUBLICATIONS

S. Tsuda et al., "First demonstration of FinFET split-gate MONOS for high-speed and highly-reliable embedded flash in 16/14nm-node and beyond", IEEE IEDM, Dec. 3-7, 2016, pp. 11.1.1-11.1.4, San Francisco, CA, USA.

* cited by examiner

*Primary Examiner* — Uyen Smet

(57) ABSTRACT

A nonvolatile memory device may operate with a logic transistor, which includes a transistor gate formed of a material. The memory device includes a floating gate formed of the material, a first-type fin, and a second-type fin. The first-type fin includes a first-type channel, a first-type source, and a first-type drain. The first-type channel, the first-type source, and the first-type drain have a first conductivity type. The second-type fin includes a second-type channel, a second-type source, and a second-type drain. The second-type source and the second-type drain have the first conductivity type. The second-type channel has a second conductivity type opposite to the first conductivity type. The floating gate is positioned on the first-type channel and the second-type channel.

28 Claims, 2 Drawing Sheets

SEMICONDUCTOR CMOS NON-VOLATILE MEMORY DEVICE

BACKGROUND

The technical field is related to memory devices, e.g., nonvolatile memory (NVM) devices.

Nonvolatile flash memory devices with multi-time programmability and one-time programmable (OTP) memory devices have been introduced for beneficial use in a number of applications where customization is required for both digital and analog designs. These applications include firmware program code, data storage, encryption key, reference trimming, manufacturing ID, security ID, and many other applications. Embedding flash memory or OTP memory within standard FINFET logic semiconductor process nonetheless comes at the expense of some additional add-on processing steps.

SUMMARY OF THE INVENTION

Embodiments may overcome disadvantages of conventional memory devices.

Embodiments may be related to a memory device (or "memory" for conciseness), e.g., a nonvolatile flash memory and/or a one-time programmable memory, positioned on a substrate and including a floating gate which is formed of the same material of the standard logic transistor gate, at least one first-type fin (with a source, a drain and a channel), a second-type fin (with source and drain and channel region), and a third-type fin (with a source, a drain and a channel). The first-type semiconductor fin and the floating gate form a coupling capacitor of the memory cell.

In embodiments, programming and erase operations of the NVM cell are performed by injecting electrons and holes, respectively, through the third-type fin into the floating gate. The read operation of the NVM cell is performed by operating the source, drain and channel of the second-type fin, along with the floating gate, as an access transistor.

In embodiments, a NVM cell may include at least one first-type fin (with a source, a drain and a channel) and a second-type fin (with a source, a drain and a channel) without including a third-type fin. In embodiments, programming and erase operations of the NVM cell are performed by injecting electrons and holes, respectively, through the second-type fin into the floating gate, while the read operation of the NVM cell is performed by operating the source, drain and channel of the second-type fin, along with the floating gate, as an access transistor.

DETAILED DESCRIPTION OF EXAMPLE EMBODIMENTS

Memory devices according to example embodiments are described with reference to FIG. 1 and FIG. 2. In a FINFET Complementary Metal Oxide Semiconductor (CMOS) logic process according to embodiments, a floating gate non-volatile memory device is constructed with the same standard transistor gate and silicon fin materials and formed mainly by sharing the same processing steps as the logic FINFET transistors on the same substrate.

The terms "first," "second," etc. may be used to describe various elements and/or to distinguish one element from another element. Thus, a first element may be termed a second element without departing from one or more embodiments. The description of an element as a "first" element may not require or imply the presence of a second element. The terms "first," "second," etc. may also be used to different types or sets of elements.

Memory devices according to embodiments are capable of being electrically erased and re-programmed repeatedly and may be used as non-volatile flash memories including multiple-time programmable (MTP) memories and/or one-time-programmable (OTP) memories.

Figure 1:
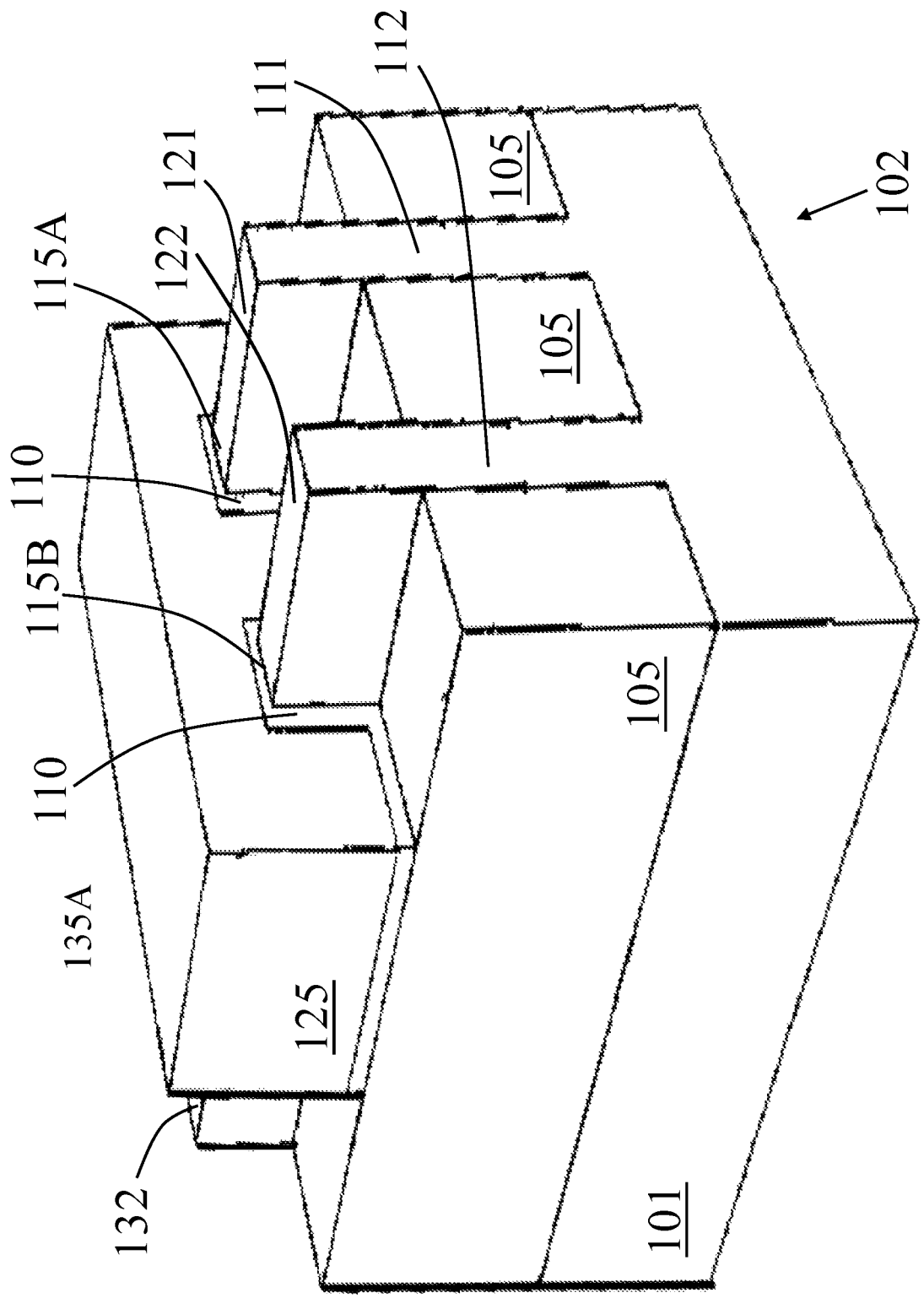
FIG. 1 illustrates a perspective view of a floating gate non-volatile memory device with 2 semiconductor fin types according to example embodiments.

FIG. 1 illustrates a perspective view of a floating gate non-volatile memory device 102 with 2 semiconductor fin types according to example embodiments.

Referring to FIG. 1, the memory device 102 may include one or more first-type fins (e.g., one or more control-type fins), one or more second-type fins (e.g., one or more read-write-type fins), a dielectric insulator 110, and a floating gate 125 on a substrate 101. The one or more first-type fins may include a first-type fin 111. The first-type fin 111 may include a first-type channel 115A, a first-type source 121, and a first-type drain, wherein the first-type channel 115A, the first-type source 121, and the first-type drain has a first conductivity type (e.g., an N-type or a P-type). The one or more second-type fins may include a second-type fin 112. The second-type fin 112 may include a second-type channel 115B, a second-type source 122, and a second-type drain 132. Each of the second-type source 122 and the second-type drain 132 has the first conductivity type (e.g. the N-type or the P-type); the second-type channel 115B has a second conductivity type opposite to the first conductivity type. For example, when/if the first conductivity type is the N-type, the second conductive type is the P-type; when/if the first conductivity type is the P-type, the second conductive type is the N-type. The dielectric insulator 110 is positioned on both the first-type fin 111 and the second-type fin 112 and insulates the first-type fin 111 and the second-type fin 112 from the floating gate 125.

The floating gate 125 overlaps (and/or is positioned over) the first-type channel 115A and the second-type channel 115B. The dielectric 110 may be made of silicon dioxide, insulates the floating gate 125 from each of the first-type channel 115A and the second-type channel 115b, and may directly contact each of the floating gate 125, the first-type channel 115A, and the second-type channel 115B. The floating gate 125 modulates the transistor channel 115B conductance in the semiconductor silicon fin 112 across the dielectric 110 according to the voltage potential on the floating gate. The FINFET MOS transistor in the NVM device 102 may include the floating gate 125, source 122, drain 132, and read channel 115B, and operates the read, program and erase functions of the memory device 102.

In this NVM device 102 embodiment, to program the n-type memory device to high threshold voltage state, a bias condition to generate channel hot electrons is applied to source 122, drain 132, and the electrode 121 connected to the control gate. To erase the n-type memory device to low threshold voltage state, a bias condition to generate channel hot holes is applied to source 122, drain 132, and the electrode 121 connected to the control gate. These write operations are performed through moving electrons across a portion of the dielectric insulator 110 positioned between the floating gate 125 and the semiconductor fin 112.

Figure 2:
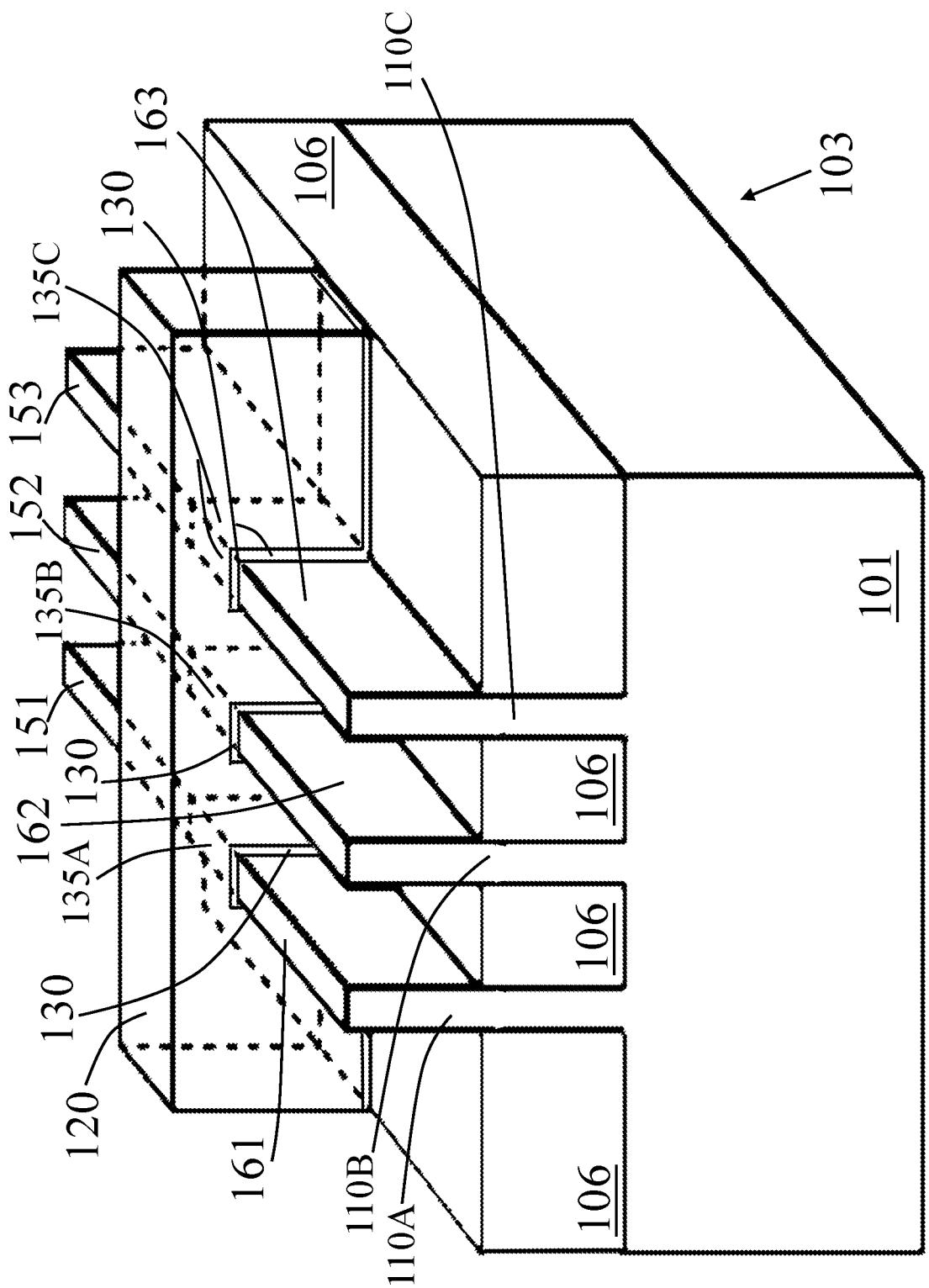
FIG. 2 illustrates a perspective view of a floating gate non-volatile memory device with 3 semiconductor fin types according to example embodiments.

FIG. 2 illustrates a perspective view of a floating gate non-volatile memory device 103 with 3 semiconductor fin types according to example embodiments.

Referring to FIG. 2, the memory device 103 may include a floating gate 120, a gate dielectric 130, one or more write-type fins including a write-type fin 110A, one or more read-type fins including a read-type fin 110B, and one or more gate-coupling-type fins including a gate-coupling-type fin 110C on a substrate 101. The semiconductor write-type fin 110A, read-type fin 110B, and gate-coupling-fin 110C may serve the major write, read, and gate coupling control electrode functions, respectively, for the semiconductor memory device.

A plurality of silicon fins is formed by etching after photolithography patterning on a silicon substrate 101, and a set of dielectric insulators 106 (e.g., a set of oxide insulators) fills bottom portions of the trenches between the fins to isolate the devices built on top portions of the fins.

The gate-coupling-type semiconductor fin 110C is substantially surrounded by floating gate 120 and is selectively heavy doped with the impurity type (e.g., an N-type) opposite to the impurity type (e.g., a P-type) of the substrate 101. The gate-coupling-type semiconductor fin 110C and the floating gate 120, with the dielectric insulator 130 being positioned in between, form a coupling capacitor of the memory device 103. One side of the gate-coupling-type semiconductor fin 110C (which functions as an electrode of the coupling capacitor) functions as the control gate of the memory device 103 using the source 153 and/or drain 163 electrically connected to the channel 135C (between the source 153 and drain 163) in fin 110C. The channel 135C has an impurity type identical to the impurity type of the source 153 and drain 163. By applying voltage on the control gate of the memory device 103 through the contact on the source 153 and/or drain 163, the voltage on the floating gate 120 is coupled to a fraction of the applied voltage according to the memory device gate coupling ratio, which is dependent on the device structure design.

The read-type fin 110B may include a read channel region 135B. The read channel region 135B is covered by the gate dielectric 130 and is selectively doped with low concentration. The impurity type of the read channel region 135B is the same as the impurity type of the silicon substrate 101. The read-type fin 110B may further include a source 152 and a drain 162 positioned at two opposite sides with respect to the floating gate 120. The floating gate 120 covers the read channel region 135B with the gate dielectric 130 positioned in between. The FINFET MOS read transistor may include the floating gate 120, source 152, drain 162, and read channel 135B, and operates the major read function of the memory device 103.

The write-type semiconductor fin 110A is substantially surrounded by the floating gate 120 with the gate dielectric 130 being positioned in between, is selectively doped with an impurity type the same as the impurity type of the substrate 101, includes a source 151 and a drain 161 positioned on two opposite sides of floating gate 120, and includes a channel region 135A covered by the dielectric 130. The floating gate 120, the channel region 135A, the source 151, and the drain 161 form the FINFET MOS write transistor for the major programming and erasing operations, which are performed through moving electrons across a portion of the dielectric insulator 130 positioned between the floating gate 120 and the write-type fin 110A.

Embodiments may be related to methods of manufacturing and/or operating one or more of the devices. The bias conditions for the floating gate FINFET write transistor and read transistor are different. To program the n-type MOS memory device 103 to high threshold voltage state, a channel hot electron mechanism and a bias condition may apply to only the write transistor (which includes the write-type fin 110A). To erase the n-type MOS memory device 103 to low threshold voltage state, a channel hot hole mechanism and a bias condition may apply to only the write transistor (which includes the write-type fin 110A). The frequent moving of electrons or holes across the dielectric insulator 130 occurs only on the write transistor with the write-type fin 110A, and does not affect read current characteristics of the memory device 103. The read transistor with the read-type fin 110B does not contain de-graded dielectric potentially caused by program erase cycles. Advantageously, the memory device may have desirable durability, satisfactory reliability, and/or sufficient read accuracy.

The described embodiments are illustrative examples and may be modified in various ways without departing from the scope defined by the claims.

What is claimed is:

1. A memory device for operating with a logic transistor, the logic transistor comprising a transistor gate, the transistor gate formed of a material, the memory device comprising:
   substrate;
   a floating gate positioned on the substrate and formed of the material;
   at least one first-type fin positioned on the substrate comprising a first-type channel, a first-type source, and a first-type drain, wherein each of the first-type channel, the first-type source, and the first-type drain has a first conductivity type;
   a second-type fin positioned on the substrate and comprising a second-type channel, a second-type source, and a second-type drain, wherein each of the second-type source and the second-type drain has the first conductivity type, wherein the second-type channel has a second conductivity type opposite to the first conductivity type;
   a dielectric insulator positioned on the first-type fin and the second-type fin and insulating each of the first-type fin and the second-type fin from the floating gate;
   wherein the floating gate is positioned on the first-type channel and the second-type channel, and
   wherein the memory device is a nonvolatile memory device.

2. The memory device according to claim 1, wherein the floating gate and the first-type fin form a coupling capacitor for the memory device.

3. The memory device according to claim 1, wherein the first-type source and the first-type drain form a control gate of the memory device.

4. The memory device according to claim 1, wherein the floating gate and the second-type fin form a read transistor for the memory device.

5. The memory device according to claim 1, wherein a programming operation and an erasing operation of the memory device are performed through electrons moving across a portion of the dielectric insulator positioned between the floating gate and the second-type fin.

6. The memory device according to claim 1, wherein at least one first-type fin includes a plurality of first-type fins.

7. The memory device according to claim 1, wherein the memory device is a one-time programmable device.

8. The memory device according to claim 1, wherein the memory device is a multiple time programmable device.

9. A memory device for operating with a logic transistor, the logic transistor comprising a transistor gate, the transistor gate formed of a material, the memory device comprising:
   substrate;
   a floating gate positioned on the substrate and formed of the material;
   at least one first-type fin positioned on the substrate comprising a first-type channel, a first-type source, and a first-type drain, wherein each of the first-type channel, the first-type source, and the first-type drain has a first conductivity type;
   a second-type fin positioned on the substrate and comprising a second-type channel, a second-type source, and a second-type drain, wherein each of the second-type source and the second-type drain has the first conductivity type, wherein the second-type channel has a second conductivity type opposite to the first conductivity type;
   a third-type fin positioned on the substrate and comprising a third-type channel, a third-type source, and a third-type drain, wherein each of the third-type source and the third-type drain has the first conductivity type, wherein the third-type channel has the second conductivity type;
   a dielectric insulator positioned on the first-type fin, the second-type fin, and the third-type fin and configured to insulate each of the first-type fin, the second-type fin, and the third-type fin from the floating gate;
   wherein the floating gate is positioned on the first-type channel, the second-type channel, and the third-type channel,
   wherein the memory device is a nonvolatile device, and
   wherein a bias condition for the second-type fin is different from a bias condition for the third-type fin.

10. The memory device according to claim 9, wherein the floating gate and the first-type fin form a coupling capacitor for the memory device.

11. The memory device according to claim 9, wherein the first-type source and the first-type drain form a control gate of the memory device.

12. The memory device according to claim 9, wherein the floating gate and the second-type fin form a read transistor for the memory device.

13. The memory device according to claim 9, wherein a programming operation and an erasing operation of the memory device are performed through electrons moving across a portion of the dielectric insulator positioned between the floating gate and the third-type fin.

14. The memory device according to claim 9, wherein the at least one first-type fin includes a plurality of first-type fins.

15. The memory device according to claim 9, wherein the memory device is a one-time programmable device.

16. The memory device according to claim 9, wherein the memory device is a multiple time programmable device.

17. A method of operating a memory device and a logic transistor, the logic transistor comprising a transistor gate, the transistor gate formed of a material, method comprising:
   operating a floating gate, which is positioned on a substrate and formed of the material;
   operating at least one first-type fin, which is positioned on the substrate and comprises a first-type channel, a first-type source, and a first drain, wherein each of the first-type channel, the first-type source, and the first-type drain has a first conductivity type; and
   operating a second-type fin, which is positioned on the substrate and comprises a second-type channel, a second-type source, and a second-type drain, wherein each of the second-type source and the second-type drain has the first conductivity type, wherein the second-type channel has a second conductivity type opposite to the first conductivity type;
   operating the memory device as a nonvolatile memory device,
   wherein a dielectric insulator is positioned on the first-type fin and the second-type fin and insulates each of the first-type fin and the second-type fin from the floating gate, and
   wherein the floating gate is positioned on the first-type channel and the second-type channel.

18. The method according to claim 17, comprising: using the floating gate and the first-type fin to form a coupling capacitor for the memory device.

19. The method according to claim 17, comprising: using the first-type source and the first-type drain to form a control gate of the memory device.

20. The method according to claim 17, comprising: using the floating gate and the second-type fin to form a read transistor for the memory device.

21. The method according to claim 17, comprising: performing a programming operation and an erasing operation of the memory device through electrons moving across a portion of the dielectric insulator positioned between the floating gate and the second-type fin.

22. The method according to claim 17, wherein the at least one first-type fin includes a plurality of first-type fins.

23. The method according to claim 17, comprising: operating the memory device as a one-time programmable device.

24. The method according to claim 17, comprising: operating the memory device as a multiple time programmable device.

25. The method according to claim 17, comprising: performing an erasing operation using channel hot hole injection through the second-type fin.

26. The method according to claim 17, comprising:
   operating a third-type fin, which is positioned on the substrate and comprises a third-type channel, a third-type source, and a third-type drain, wherein each of the third-type source and the third-type drain has the first conductivity type, wherein the third-type channel has the second conductivity type, and wherein a bias condition for the second-type fin is different from a bias condition for the third-type fin.

27. The method according to claim 26, comprising:
   using the floating gate and the second-type fin to form a read transistor for the memory device; and
   performing a programming operation and an erasing operation of the memory device through electrons moving across a portion of the dielectric insulator positioned between the floating gate and the third-type fin.

28. The method according to claim 26, comprising: performing an erasing operation using channel hot hole injection through the third-type fin.

* * * * *